United States Patent
Tanaka

(10) Patent No.: US 8,120,953 B2
(45) Date of Patent: Feb. 21, 2012

(54) READING METHOD OF NONVOLATILE SEMICONDUCTOR MEMORY DEVICE

(75) Inventor: Tsuyoshi Tanaka, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 12/654,062

(22) Filed: Dec. 9, 2009

(65) Prior Publication Data
US 2010/0149871 A1 Jun. 17, 2010

(30) Foreign Application Priority Data

Dec. 11, 2008 (JP) .................................. 2008-315854
Aug. 13, 2009 (KR) ........................ 10-2009-0074848

(51) Int. Cl.
*G11C 16/04* (2006.01)

(52) U.S. Cl. ......... 365/185.03; 365/185.02; 365/185.18; 365/185.22; 365/185.24

(58) Field of Classification Search ............. 365/185.03, 365/185.18, 185.22, 185.24
See application file for complete search history.

(56) References Cited

U.S. PATENT DOCUMENTS

| 7,359,248 B2 * | 4/2008 | Chen et al. | 365/185.22 |
| 7,405,977 B2 * | 7/2008 | Lee et al. | 365/185.23 |
| 7,440,318 B2 * | 10/2008 | Fong et al. | 365/185.02 |
| 2009/0185418 A1 * | 7/2009 | Im | 365/185.03 |

FOREIGN PATENT DOCUMENTS

JP 07-098989 A 4/1995

* cited by examiner

*Primary Examiner* — Hoai V Ho
*Assistant Examiner* — Tri Hoang
(74) *Attorney, Agent, or Firm* — Lee & Morse, P.C.

(57) ABSTRACT

Reading methods of a nonvolatile semiconductor memory device are described herein. Methods may include supplying, to a word line, one of a voltage corresponding to a highest reading level or a voltage having a level higher than a first reading level of a read operation to be performed on the word line, and subsequently supplying a voltage of the first reading level to the word line and performing the read operation.

10 Claims, 4 Drawing Sheets

READING METHOD OF NONVOLATILE SEMICONDUCTOR MEMORY DEVICE

BACKGROUND

1. Field

Embodiments relate to nonvolatile semiconductor memory devices, including non-volatile memory devices having a multi-level cell architecture. More particularly, embodiments relate to a reading method of a nonvolatile memory device that may be effectively applied to non-volatile memory devices that have a multi-level cell architecture.

2. Description of the Related Art

A multi-level cell (MLC) architecture is useful in storing multi-data in nonvolatile semiconductor memory devices. In nonvolatile semiconductor memory devices employing the MLC architecture, N−1 word line voltage supplying steps are required for a one-time read operation. Here, N is a number representing a critical value in an MLC, and N−1 corresponds to 3 normally.

In general, in an MLC device, a word line voltage may be controlled through three steps, i.e., low-level (L) step, medium-level (M) step, and high-level (H) step. Further, during a read operation in an MLC nonvolatile memory device, one of 2-bit data may be read out depending on whether a current flows in an MLC during one of three steps.

However, a read cycle in a general memory is predefined according to the specifications. The memory performs word line voltage supplying steps within a read cycle so as to output data. If a start-up time of the word line voltage is late, the memory performs a read operation even though the word line voltage may not have reached a target voltage level. This leads to reading error and difficulty in securing margin. Furthermore, it is difficult to secure sufficient margin because a load of a word line becomes heavier with increased capacitance, the respective word line voltages at a near end and a far end of a cell array differ from each other due to the delay caused by the load so that it is difficult to secure sufficient margin.

In an attempt to reduce reading error and/or secure sufficient margin, sensing time may be increased to enable the word line voltage to reach the target voltage level, however, a total read cycle may then be increased. Additional decoders may be used to drive the word line voltage to the target voltage faster, however, additional decoders require additional layout area.

SUMMARY

Embodiments are therefore directed to a reading method of nonvolatile memory devices, which substantially overcome one or more of the problems due to the limitations and disadvantages of the related art.

It is therefore a feature of an embodiment to provide a reading method of a nonvolatile memory device that is adapted to accelerate a start-up time of a word line voltage as compared to conventional reading methods.

It is therefore a separate feature of an embodiment to provide a reading method of a nonvolatile memory device that improves a reading accuracy of a high-speed read operation as compared to conventional reading methods.

It is therefore a separate feature of an embodiment to provide a reading method of a nonvolatile memory device that is adapted to perform a read operation with sufficient margin.

It is therefore a separate feature of an embodiment to provide a reading method of a nonvolatile memory device having improved reading accuracy and/or sufficient margin without increasing layout area as compared to comparable conventional devices, e.g., conventional devices/methods with similar reading accuracy and/or margin.

It is therefore a separate feature of an embodiment to provide a reading method that may only require a voltage converter and/or a discharging unit, and therefore a layout area thereof may not be increased in comparison to comparable conventional devices/methods, e.g., conventional reading methods employing a sub decoder.

At least one of the above and other features and advantages may be realized by providing a reading method of a nonvolatile semiconductor memory device, the method including supplying, to a word line, one of a voltage corresponding to a highest reading level or a voltage having a level higher than a first reading level of a read operation to be performed on the word line, and subsequently supplying a voltage of the first reading level to the word line and performing the read operation.

Supplying the voltage of the first reading level may be continued during a first sensing period of the read operation.

The method include discharging a voltage of the word line to a first discharge voltage level lower than a voltage of a second reading level of the read operation, the voltage of the second reading level may be lower than a voltage of the first reading level.

Discharging the voltage of the word line may be performed by an NMOS transistor connected to the word line.

Supplying the voltage of the second reading level may be continued during a second sensing period of the read operation.

The method may include discharging a voltage of the word line to a second discharge voltage level lower than a voltage of a third reading level of the read operation, the voltage of the third reading level may be lower than a voltage of the second reading level.

Supplying the voltage of the third reading level may be continued during a third sensing period of the read operation.

Discharging the voltage of the word line to a second discharge voltage level may be performed by an NMOS transistor connected to the word line.

The voltage having a level higher than the first reading level of a read operation may correspond to a voltage of a second reading level of the read operation, the voltage of the second reading level being higher than the voltage of the first reading level.

Supplying the voltage of the first reading level may be continued during a first sensing period of the read operation, and the method may include supplying, to the word line, a third voltage having a level higher than a second reading level of the read operation to be performed on the word line, and subsequently supplying a voltage of the second reading level to the word line, wherein supplying the voltage of the second reading level may be continued during a second sensing period of the read operation.

The third voltage may correspond to a voltage of a third reading level of the read operation, the voltage of the third reading level being higher than the voltage of the second reading level.

The method may include supplying, to the word line, a fourth voltage having a level higher than a third reading level of the read operation to be performed on the word line, and subsequently supplying a voltage of the third reading level to the word line, wherein supplying the voltage of the third reading level may be continued during a third sensing period of the read operation.

The nonvolatile semiconductor memory device may have a multi-level cell (MLC) architecture in which a read operation is performed by supplying a low-level voltage, a medium-level voltage and a high-level voltage to the word line, the supplying, to the word line, one of the voltage corresponding to the highest reading level or the voltage having the level higher than the first reading level of the read operation to be performed on the word line, may include supplying, to the word line, the medium-level voltage when the voltage of the first reading level to be subsequently supplied is the low-level voltage, supplying, to the word line, the high-level voltage when the voltage of the first reading level to be subsequently supplied is the medium-level voltage, and supplying, to the word line, a voltage having a higher level than the high-level voltage when the first reading level to be subsequently supplied is the high-level voltage.

At least one of the above and other features and advantages may be separately realized by providing a reading method of a nonvolatile semiconductor memory device performing a read operation by supplying a voltage of a predetermined level to a word line, the method including starting up a word line voltage by supplying a voltage having a voltage level higher than the predetermined level to the word line, supplying the voltage of the predetermined level to the word line, and setting the word line voltage of the predetermined level and performing the read operation.

The nonvolatile semiconductor memory device may have a multi-level cell (MLC) architecture in which a read operation maybe performed by supplying a low-level voltage, a medium-level voltage and a high-level voltage to the word line, when the low-level voltage is supplied to the word line, the word line voltage may be started up by supplying the medium-level voltage to the word line and the low-level voltage is then supplied to the word line, when the medium-level voltage is supplied to the word line, the word line voltage may be started up by supplying the high-level voltage to the word line and the medium-level voltage is then supplied to the word line, and when the high-level voltage is supplied to the word line, the word line voltage may be started up by supplying a voltage higher than the high-level voltage to the word line and the high-level voltage is then supplied to the word line.

At least one of the above and other features and advantages may be separately realized by providing a reading method of a nonvolatile semiconductor memory device performing a read operation by sequentially supplying voltages having a plurality of voltage levels to a word line, the method including performing a read operation by supplying a voltage having a highest voltage level to the word line, and performing a read operation by supplying a voltage, of which a level is lower by one level than the highest level, to the word line after a voltage level of the word line voltage is lowered through discharging.

The discharging of the word line voltage may be performed by an NMOS transistor connected to the word line.

The nonvolatile semiconductor memory device may have a multi-level cell (MLC) architecture in which a read operation is performed by supplying a low-level voltage, a medium-level voltage and a high-level voltage to the word line, the method may include performing a read operation by supplying the high-level voltage to the word line, performing a read operation by supplying the medium-level voltage to the word line after the word line voltage is lower than the medium-level voltage through discharging of the word line voltage, and performing a read operation by supplying the high-level voltage to the word line after the word line voltage is lower than the low-level voltage through discharging of the word line voltage.

The discharging of the word line voltage may be performed by an NMOS transistor connected to the word line.

BRIEF DESCRIPTION OF THE DRAWINGS

The above and other features and advantages of exemplary embodiments will become more apparent to those of ordinary skill in the art by describing in detail exemplary embodiments with reference to the attached drawings, in which.

DETAILED DESCRIPTION

Figure 1:
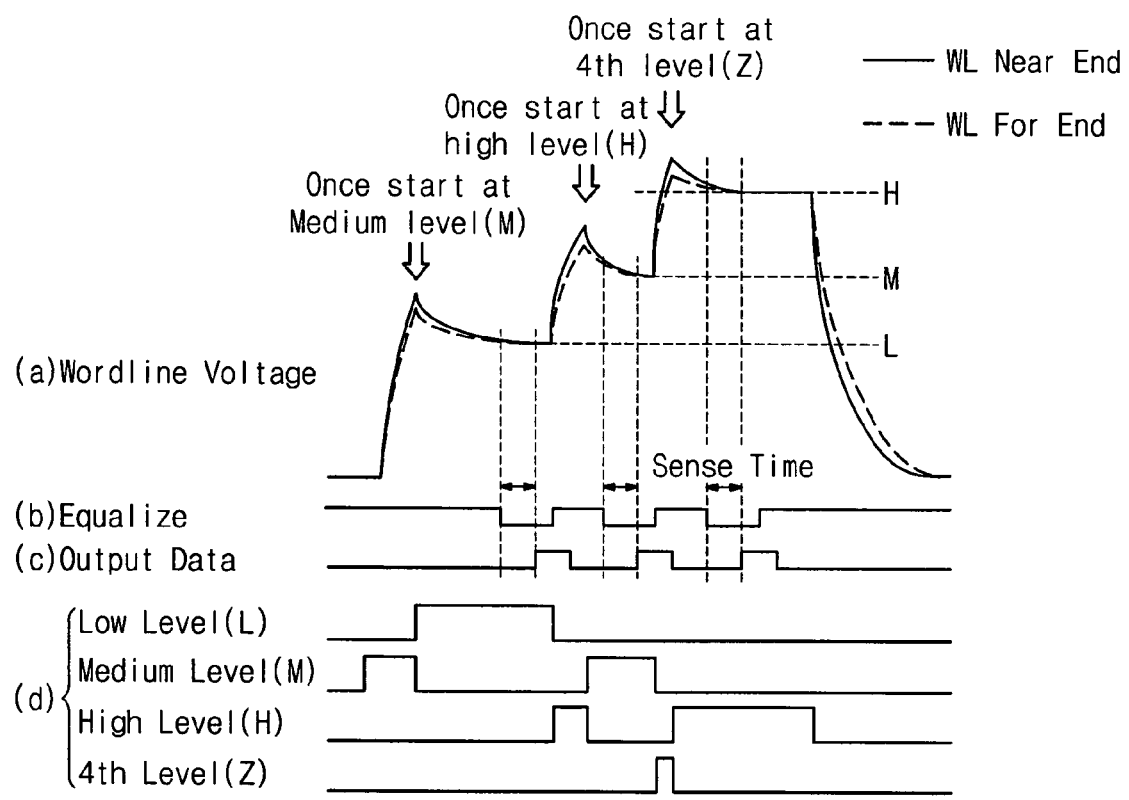
FIG. 1 illustrates a waveform diagram of an exemplary embodiment of a reading method of a nonvolatile memory device.

Japanese Patent Application No. 2008-315854, filed on Dec. 11, 2008, in the Japanese Intellectual Property Office, and Korean Patent Application No. 10-2009-0074848, filed on Aug. 13, 2009, in the Korean Intellectual Property Office, are incorporated by reference herein in their entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements/features throughout the specification.

A reading method according to the exemplary embodiment may be applied to a multi-level cell (MLC) nonvolatile memory device in which a read operation may be performed by supplying a low-level (L) voltage, a medium-level (M) voltage, and a high-level (H) voltage to a word line.

FIG. 1 illustrates a waveform diagram of an exemplary embodiment of a reading method of a nonvolatile memory device.

Referring to FIG. 1, reference symbols (a), (b), (c) and (d) represent a word line voltage, an equalized level, an output data level, and word line supply voltage levels, respectively. In the waveform diagram of the word line voltage (a), a solid line denotes a word line voltage applied to a gate of a cell that is nearest to a word line driver, and a dotted line denotes a word line voltage applied to a gate of a cell that is farthest from the word line driver.

In a nonvolatile memory device employing the MLC architecture, the read operation may be performed by supplying a low-level (L) voltage, a medium-level (M) voltage, and a high-level (H) voltage to a word line in sequence.

In the exemplary reading method illustrated in FIG. 1, the nonvolatile memory device may be driven so as to start up a word line with a voltage higher than a voltage of a read operation to be performed. For example, as shown in FIG. 1, for a read operation using a low-level (L) voltage, the nonvolatile semiconductor memory device may start up the word line voltage by supplying the medium-level (M) voltage to the word line before the read operation is performed using the low-level (L) voltage. After a start at the medium-level (M) voltage, the read operation may be performed by supplying the low-level (L) voltage to the word line.

For example, when the read operation is performed using the medium-level (M) voltage, the nonvolatile semiconductor memory device may start up the word line voltage by supplying the high-level (H) voltage to the word line first. Afterwards, the read operation may be performed by supplying the medium-level (M) to the word line.

For example, when the read operation is performed using the high-level (H) voltage, the nonvolatile semiconductor memory device may start up the word line voltage by supplying a fourth-level voltage having a voltage level (Z) higher than the high-level (H) to the word line. Then, the read operation may be performed by supplying the high-level (H) voltage to the word line.

In some embodiments, for a read operation, a respective word line may be supplied with a voltage higher than a predetermined voltage level of the read operation to be performed before the read operation is performed by supplying the voltage having the predetermined voltage level to the respective word line. More particularly, e.g., prior to a sense time of the read operation, the respective word line may be supplied with the voltage higher than the predetermined voltage level of the read operation, and during the sense time of the read operation, the respective word line may be supplied with the predetermined voltage level of the read operation such that during the sense time the respective word line may be at the predetermined voltage level.

In embodiments, by initially supplying a higher start-up voltage level, i.e., a voltage level higher than a predetermined voltage level of a respective read operation, a voltage of the word line at an arbitrary time prior to the read operation may be higher and/or the word line may be at the predetermined voltage level of the respective read operation in a reduced amount of time. More particularly, e.g., in comparison to cases in which a word line is supplied with a predetermined voltage level without an initial application of a higher start-up voltage, embodiments of a reading method employing a higher start-up voltage may be advantageous by reducing a time necessary for the word line to be at the predetermined voltage level.

That is, referring to Equation 1 below, if the word line voltage is started up using a voltage having a level higher than that of a predetermined read voltage, the start-up time of the word line voltage may be shorter as compared, e.g., to cases in which the word line voltage is started up with the predetermined read voltage.

$$V_{OUT} = E\left(1 - \exp\left(-\frac{t}{RC}\right)\right) \quad \{\text{Equation 1}\}$$

where t is time, VOUT is a word line voltage, E is a start up word line voltage, e.g., higher voltage than predetermined voltage of read operation, and RC corresponds to a load included in a driver and a word line.

Embodiments of a nonvolatile semiconductor memory device and/or a method of reading a nonvolatile semiconductor memory device may enable a start-up time of a word line voltage to be accelerated, and/or setting of the word line to the predetermined read voltage to be accelerated, including the setting of the predetermined read voltage in MLCs at a near end and/or a far end of a cell array. Embodiments of a nonvolatile semiconductor memory device may enable securing a margin to be improved as compared to comparable conventional devices, and may thereby enable high-speed read operations to be realized. Further, in embodiments, because a read operation may, e.g., only employ a voltage converter, embodiments of a reading method having one or more features described herein may not increase a layout area. More particularly, e.g., in comparison to a reading operation employing sub-decoders for relieving a load of a main word line in order to improve reading accuracy, but require additional layout area, embodiments of a reading method having one more features described herein may employ a smaller layout area.

Figure 2:
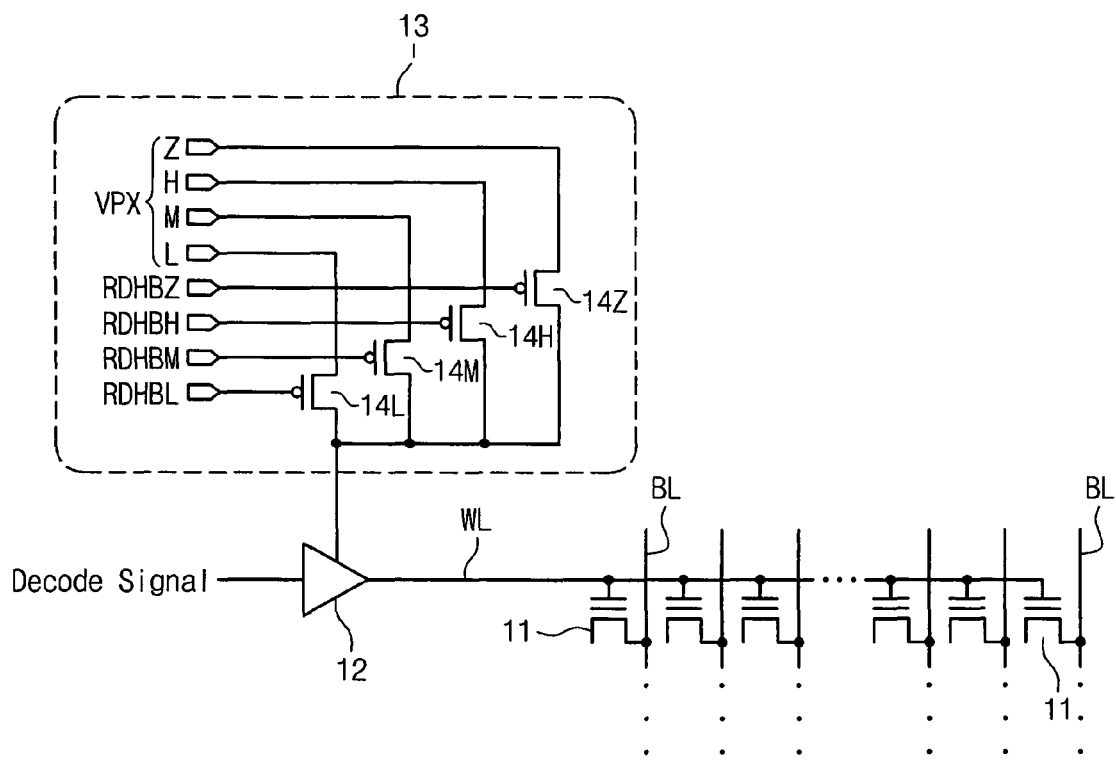
FIG. 2 illustrates an exemplary circuit diagram of an exemplary word line and a plurality of MLCs to which the exemplary reading method illustrated in FIG. 1 may be applied.

FIG. 2 illustrates an exemplary circuit diagram of an exemplary word line and a plurality of MLCs to which the exemplary reading method illustrated in FIG. 1 may be applied.

Referring to FIG. 2, a word line WL may be connected to gates of a plurality of MLCs 11. A drain of each MLC 11 may be connected to a corresponding bit line BL. The word line WL may be driven by a word line driver 12 receiving a decode signal as an input. A word line voltage converting circuit 13 may be connected to the word line driver 12.

A word line voltage converting circuit 13 may include voltage sources VPX for a low-level (L) voltage, a medium-level (M) voltage, a high-level (H) voltage, and a fourth-level (Z) voltage, and first, second, third and fourth switch transistors 14L, 14M, 14H and 14Z. The first, second, third and fourth switch transistors 14L, 14M, 14H and 14Z may supply voltages of the voltage sources VPX, i.e., the low-level (L) voltage, the medium-level (M) voltage, the high-level (H) voltage, and the fourth-level (Z) voltage, to the word line driver 12. The first switch transistor 14L may be controlled by a first switch control signal RDHBL to supply the low-level (L) voltage to the word line driver 12. The second switch transistor 14M may be controlled by a second switch control signal RDHBM to supply the medium-level (M) voltage to the word line driver 12. The third switch transistor 14H may be controlled by a third switch control signal RDHBH to supply the high-level (H) voltage to the word line driver 12. The fourth switch transistor 14Z may be controlled by a fourth switch control signal RDHBZ to supply the fourth-level (Z) voltage to the word line driver 12.

Operations of the first, second, third and fourth switch transistors 14L, 14M, 14H and 14Z will be more fully described to realize the exemplary embodiment of a reading method.

To read data by supplying the low-level (L) voltage to the word line WL, the second switch transistor 14M may be turned on first by the second switch control signal RDHBM to supply the medium-level (M) voltage to the word line driver 12 or the word line WL. Thereafter, the first witch transistor 14L may be turned on by the first switch control signal RDHBL to supply the low-level (L) voltage to the word line driver 12 or the word line WL.

To read data by supplying the medium-level (M) voltage to the word line WL, the third switch transistor 14H may be turned on first by the third switch control signal RDHBH to supply the high-level (H) voltage to the word line driver 12 or the word line WL. Thereafter, the second switch transistor 14M may be turned on by the second switch control signal RDHBM to supply the medium-level (M) voltage to the word line driver 12 or the word line WL.

To read data by supplying the high-level (H) voltage to the word line WL, the fourth switch transistor 14Z may be turned on first by the fourth switch control signal RDHBZ to supply the fourth-level (Z) voltage to the word line driver 12 or the word line WL. Thereafter, the third switch transistor 14H may be turned on by the third switch control signal RDHBH to supply the high-level (H) voltage to the word line driver 12 or the word line WL.

The low-level (L) voltage, the medium-level (M) voltage, and the high-level (H) voltage may be generated in existing circuitry, whereas the fourth-level (Z) voltage may be generated using an additional voltage source, i.e., it may not be generated from the existing circuitry. It should be understood that in some embodiments, e.g., the low-level (L) voltage, the medium-level (M) voltage, and the high-level (H) voltage may be generated using other sources.

It should be understood that the control method of the word line voltage, e.g., applying a higher start-up voltage according to the exemplary embodiment described above may also be applied to a single-level cell (SLC) memory device.

A reading method according to another exemplary embodiment that may be applied to an MLC nonvolatile memory device in which a read operation is performed by supplying a low-level (L) voltage, a medium-level (M) voltage, and a high-level (H) voltage to a word line is described below.

Figure 3:
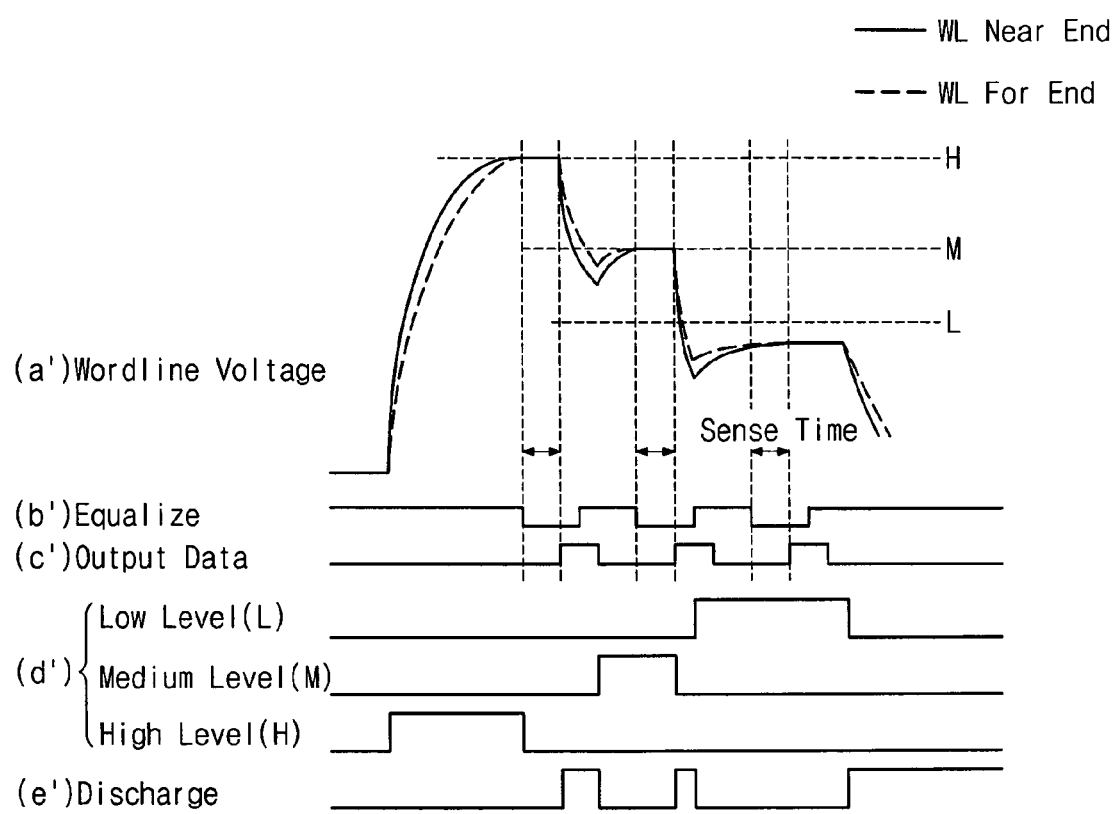
FIG. 3 illustrates a waveform diagram of another exemplary embodiment of a reading method of a nonvolatile memory device.

FIG. 3 illustrates a waveform diagram of another exemplary embodiment of a reading method of a nonvolatile memory device.

Referring to FIG. 3, reference symbols (a'), (b'), (c'), (d') and (e') represent a word line voltage, an equalized level, an output data level, word line supply voltage levels, and a discharge timing, respectively. In the waveform diagram (a') of the word line voltage, a solid line denotes a word line voltage applied to a gate of a cell that is nearest to a word line driver, and a dotted line denotes a word line voltage applied to a gate of a cell that is farthest from the word line driver.

Referring to FIG. 3, in the exemplary reading method illustrated therein, instead of, e.g., supplying a low-level (L) voltage, a medium-level (M) voltage, and a high-level (H) voltage to a word line in sequence, in the exemplary embodiment of a reading method described below, the nonvolatile semiconductor memory device may start up the word line voltage at a high-level (H) by first supplying the high-level (H) voltage to the word line. The nonvolatile semiconductor memory device may first perform the read operation at the high-level (H) while the high-level (H) voltage is supplied to the word line.

Thereafter, the nonvolatile semiconductor memory device may turn on, e.g., an NMOS discharge transistor that is connected to the word line, and may thereby discharge the word line voltage. The nonvolatile semiconductor memory device may then turn off the NMOS discharge transistor at a time when the word line voltage is less than the medium-level (M) voltage. At the same time, the nonvolatile memory device may perform the read operation at the medium-level (M) while the medium-level (M) voltage is supplied to the word line.

Afterwards, the nonvolatile semiconductor memory device may again turn on the NMOS discharge transistor, and may thereby discharge the word line voltage again. The nonvolatile semiconductor memory device may then turn off the NMOS discharge transistor at the time when the word line voltage is less than the low-level (L) voltage. At the same time, the nonvolatile memory device may perform the read operation at the low-level (L) while the low-level (L) voltage is supplied to the word line.

In such embodiments, as the start-up level of the word line may be higher than, e.g., a conventional start up voltage corresponding to, e.g., a low level voltage, a voltage level of the word line at an arbitrary time prior to a read operation may be higher or the word line may be at a voltage level of the respective read operation in a reduced amount of time. More particularly, e.g., in comparison to cases in which a word line is driven from a lowest to a highest level of a reading method, by driving a word line from, e.g., a highest level voltage to a lowest level voltage, embodiments may enable a start-up time of the word line to be shorter. This can be understood from Equation 1 discussed above and reproduced below.

$$V_{OUT} = E\left(1 - \exp\left(-\frac{t}{RC}\right)\right) \quad \{\text{Equation 1}\}$$

where t is time, VOUT is a word line voltage, E is a start up word line voltage, e.g., higher voltage than predetermined voltage of read operation, and RC corresponds to a load included in a driver and a word line.

Referring to Equation 1, because an NMOS discharge transistor is lower in resistance than a PMOS transistor, by including an NMOS discharge transistor in the driver the RC term may be smaller. That is, the load may be lighter and start-up and/or discharge may be performed in a shorter time.

Embodiments of a reading method of a nonvolatile memory device employing one or more of the features described herein may first supply a voltage having a high level, e.g., highest level (H) of a read operation, to a the word line, followed by a lower level voltage, e.g., medium level (M) of a read operation. In such embodiments, a voltage level of the applied voltage may be sequentially lowered through the discharging operation, e.g., from the medium level (M) to a low level (L). Embodiments of a reading method of a nonvolatile memory device may enable settlement of a read voltage to be shorter, i.e., accelerated, in comparison to comparable conventional devices. By accelerating settlement of the read voltage, embodiments may enable also enable settlement of the read voltage at a near end and a far end of the cell array to be accelerated. Thus, embodiments may be advantageous in enabling securing of a margin to be improved as compared to comparable conventional devices, and may thereby enable high-speed read operations to be realized. Further, in such embodiments, because a read operation may, e.g., only employ a voltage converter and/or a discharge unit, embodiments of a reading method having one or more features described herein may not increase a layout area. More particularly, e.g., in comparison to a reading operation employing sub-decoders for relieving a load of a main word line in order to improve reading accuracy, but which require additional layout area, embodiments of a reading method having one more features described herein may employ a smaller layout area.

Figure 4:
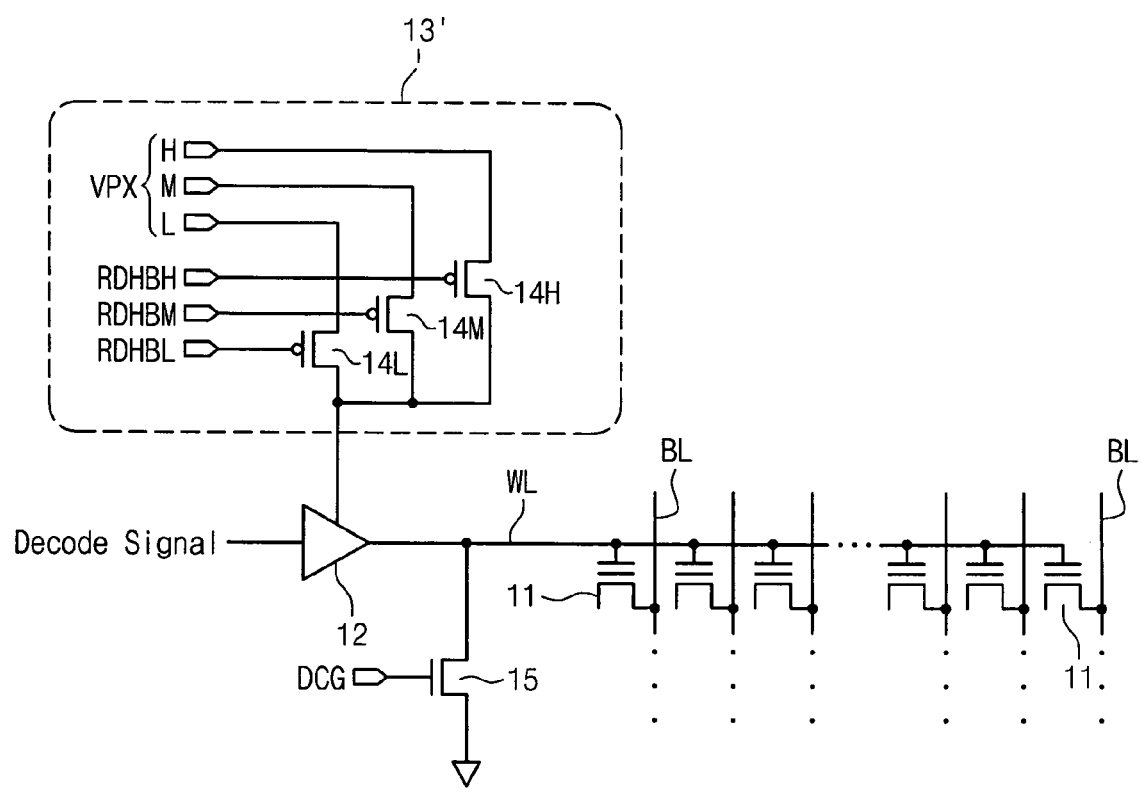
FIG. 4 illustrates an exemplary circuit diagram of an exemplary word line and a plurality of MLCs to which the exemplary reading method illustrated in FIG. 3 may be applied.

FIG. 4 illustrates an exemplary circuit diagram of an exemplary word line and a plurality of MLCs to which the exemplary reading method illustrated in FIG. 3 may be applied.

Referring to FIG. 4, a word line voltage converting circuit 13' illustrated therein may be similar in configuration to the exemplary circuit 13 of FIG. 2 with the exception that the fourth-level (Z) voltage source and the fourth switch transistor 14Z are omitted in the word line voltage converting circuit 13'. An NMOS transistor 15 for discharging the word line voltage may be connected to the word line WL. The NMOS transistor 15 may be controlled according to a word line discharge control signal DCG.

The word line voltage converting circuit 13' may turn on the third switch transistor 14H first in response to the third switch control signal RDHBH and may thereby supply the high-level (H) voltage to the word line driver 12 or the word line WL. Resultantly, the read operation may be performed with the high-level (H) voltage.

Thereafter, the word line voltage converting circuit 13' may turn on the NMOS transistor 15 according to the word line discharge control signal DCG and may thereby discharge the word line voltage. The word line voltage converting circuit 13' may turn off the NMOS transistor 15 at a time when the word line voltage becomes lower than the medium-level (M) voltage. At the same time, the word line voltage converting circuit 13' may turn on the second switch transistor 14M according to the second switch control signal RDHBM to supply the medium-level (M) voltage to the word line driver 12 or the word line WL. Resultantly, the read operation may be performed with the medium-level (M) voltage.

Afterwards, the word line voltage converting circuit 13' may turn on the NMOS transistor 15 again according to the word line discharge control signal DCG and may thereby discharge the word line voltage again. The word line voltage converting circuit 13' may turn off the NMOS transistor 15 at a time when that the word line voltage becomes lower than the low-level (L) voltage. Simultaneously, the word line voltage converting circuit 13' may turn on the first switch transistor 14L according to the first switch control signal RDHBL to supply the low-level (L) voltage to the word line driver 12 or the word line WL. As a result, the read operation may be performed with the low-level (L) voltage.

In embodiments of a nonvolatile semiconductor memory device and/or reading method of a nonvolatile memory device employing one or more features described above, a read operation may be performed in such a way that a voltage having a predetermined level is supplied to the word line after starting up the word line voltage by supplying a voltage having a level that is higher than a lowest predetermined voltage level of the reading operation.

For example, in some embodiments, a medium voltage corresponding to a medium level voltage of an MLC reading operation may be applied to a respective word line before a lowest level voltage of the reading method is applied to the respective word line. More particularly, e.g., in some embodiments, a nonvolatile memory device and/or method of reading a nonvolatile memory device may involve starting up a word line voltage by supplying a voltage having a second voltage level higher than a first voltage level. The nonvolatile semiconductor memory device may supply the voltage of the second voltage level to the respective word line. Thereafter, the nonvolatile semiconductor memory device may supply the voltage of the first level to the word line. The nonvolatile semiconductor memory device may then perform the read operation while a voltage of the first level is supplied to the word line. In the start-up (i.e., increasing) phase of each voltage level, the nonvolatile semiconductor memory device may employ a voltage having a higher voltage level than a corresponding voltage level for performing the respective read operation.

In some other embodiments, e.g., a reading operation may begin at a highest level voltage, e.g., high level (H), so as to initially charge up the respective word line to the high level value (H) and then respectively discharge the word line to perform reading operations at lower voltage levels, e.g., a medium level (M) and/or low level (L), by discharging the respective word line to a voltage level lower than the reading operation to be performed. More particularly, in such embodiments, the respective word line may be discharged to a voltage lower than a voltage level for performing the respective reading operation before supplying a voltage for performing the respective reading operation to the respective word line. That is, in such embodiments, e.g., each subsequent start up phase after the initial highest level may involve a respective start up voltage lower than a voltage of a respective reading operation, e.g., for a medium level (M) voltage reading operation, a start up voltage having a voltage level less than the medium level (M) voltage and more than the low level (L) voltage may be employed.

Embodiments employing one or more features described herein may reduce a read operation time by increasing, e.g., precharging, a respective word line voltage using a voltage of a level higher than a corresponding reading operation voltage level, or decreasing, e.g., discharging, a respective word line voltage using a voltage of a level lower than a corresponding reading operation voltage level, prior to a sensing period. In such embodiments, the word line voltage may be precharged during a precharge period and/or the word line voltage may be discharged during a discharge period.

In embodiments, switch control signals, e.g., RDHBL, RDHBM, RDHBH and RDHBZ, and a word line discharge control signal, e.g., DCG, may be generated in a control circuit (not shown) configured to control an overall operation of the nonvolatile semiconductor memory device.

As described above, reading methods employing one or more features described above may enable a start-up time of a word line voltage to be reduced, which may enable a high-speed read operation to be realized. Further, embodiments may enable a read operation to be performed with a sufficient margin. Further, embodiments may provide one or more of the advantages described above without increasing a layout area and/or while maintaining a smaller layout area than comparable conventional devices.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A reading method of a nonvolatile semiconductor memory device, the method comprising:
   supplying, to a word line, one of a voltage corresponding to a highest reading level or a voltage having a level higher than a first reading level of a read operation to be performed on the word line;
   subsequently supplying a voltage of the first reading level to the word line and performing the read operation;
   subsequently supplying a voltage of the second reading level to the word line, wherein supplying the voltage of the second reading level is continued during a first sensing period of the read operation;
   supplying, to the word line, a fourth voltage having a level higher than a third reading level of the read operation to be performed on the word line; and
   subsequently supplying a voltage of the third reading level to the word line, wherein supplying the voltage of the third reading level is continued during a third sensing period of the read operation,
   wherein the voltage having a level higher than the first reading level of a read operation corresponds to a voltage of a second reading level of the read operation, the voltage of the second reading level being higher than the voltage of the first reading level, and the third voltage corresponds to a voltage of a third reading level of the read operation, the voltage of the third reading operation being higher than the voltage of the second reading level.

2. The reading method as claimed in claim 1, wherein supplying the voltage of the first reading level is continued during a first sensing period of the read operation.

3. The reading method as claimed in claim 2, further comprising discharging a voltage of the word line to a first discharge voltage level lower than a voltage of a second reading level of the read operation, the voltage of the second reading level being lower than a voltage of the first reading level.

4. The reading method as claimed in claim 3, wherein discharging the voltage of the word line is performed by an NMOS transistor connected to the word line.

5. The reading method as claimed in claim 3, further comprising discharging a voltage of the word line to a second discharge voltage level lower than a voltage of a third reading level of the read operation, the voltage of the third reading level being lower than a voltage of the second reading level.

6. The reading method as claimed in claim 5, wherein discharging the voltage of the word line to a second discharge voltage level is performed by an NMOS transistor connected to the word line.

7. A reading method of a nonvolatile semiconductor memory device performing a read operation by supplying a voltage of a predetermined level to a word line, the method comprising:
  starting up a word line voltage by supplying a voltage having a voltage level higher than the predetermined level to the word line;
  supplying the voltage of the predetermined level to the word line; and
  setting the word line voltage of the predetermined level and performing the read operation,
  wherein:
  the nonvolatile semiconductor memory device has a multi-level cell (MLC) architecture in which a read operation is performed by supplying a low-level voltage, a medium-level voltage and a high-level voltage to the word line,
  when the low-level voltage is supplied to the word line, the word line voltage is started up by supplying the medium-level voltage to the word line and the low-level voltage is then supplied to the word line,
  when the medium-level voltage is supplied to the word line, the word line voltage is started up by supplying the high-level voltage to the word line and the medium-level voltage is then supplied to the word line, and
  when the high-level voltage is supplied to the word line, the word line voltage is started up by supplying a voltage higher than the high-level voltage to the word line and the high-level voltage is then supplied to the word line.

8. A reading method of a nonvolatile semiconductor memory device performing a read operation, the nonvolatile semiconductor memory device having a multi-level cell (MLC) architecture in which a read operation is performed by supplying a low-level voltage, a medium-level voltage and a high-level voltage to the word line, the method comprising:
  performing a read operation by supplying the high-level voltage to the word line,
  performing a read operation by supplying the medium-level voltage to the word line after the word line voltage is lower than the medium-level voltage through discharging of the word line voltage, and
  performing a read operation by supplying the high-level voltage to the word line after the word line voltage is lower than the low-level voltage through discharging of the word line voltage.

9. The reading method of one as claimed in claims 8, wherein the discharging of the word line voltage is performed by an NMOS transistor connected to the word line.

10. The reading method of one as claimed in claim 8 wherein the discharging of the word line voltage is performed by an NMOS transistor connected to the word line.

* * * * *